United States Patent
Kunnathodi et al.

(10) Patent No.: US 12,334,430 B1
(45) Date of Patent: Jun. 17, 2025

(54) SHIELDED INDUCTOR STRUCTURES AND METHODS OF FORMING THE SAME

(71) Applicant: GlobalFoundries U.S. Inc., Malta, NY (US)

(72) Inventors: Muhammed Shafi Kunnathodi, Bangalore (IN); Varuna Ananthapadmanabha Baipadi, Bangalore (IN); Venkata Narayana Rao Vanukuru, Bangalore (IN)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 18/633,488

(22) Filed: Apr. 11, 2024

(51) Int. Cl.
*H01L 23/522* (2006.01)
*H01L 23/00* (2006.01)

(52) U.S. Cl.
CPC ...... *H01L 23/5225* (2013.01); *H01L 23/5227* (2013.01); *H01L 24/05* (2013.01); *H01L 24/06* (2013.01); *H01L 24/08* (2013.01); *H01L 24/80* (2013.01); *H01L 2224/05554* (2013.01); *H01L 2224/0616* (2013.01); *H01L 2224/08145* (2013.01); *H01L 2224/80357* (2013.01); *H01L 2224/80379* (2013.01); *H01L 2224/80896* (2013.01); *H01L 2924/05042* (2013.01); *H01L 2924/0544* (2013.01)

(58) Field of Classification Search
CPC . H01L 23/5225; H01L 23/5227; H01L 24/06; H01L 24/08; H01L 24/80
See application file for complete search history.

(56) References Cited

U.S. PATENT DOCUMENTS

| | | | |
|---|---|---|---|
| 7,233,055 B2 | 6/2007 | Grange | |
| 7,906,371 B2 | 3/2011 | Kim et al. | |
| 10,032,750 B2 | 7/2018 | Deligianni et al. | |
| 10,775,856 B1* | 9/2020 | Morgan | G06F 1/182 |
| 11,107,779 B2 | 8/2021 | Chen et al. | |
| 2004/0178473 A1 | 9/2004 | Dentry et al. | |
| 2004/0222478 A1 | 11/2004 | Zhang et al. | |
| 2004/0222506 A1 | 11/2004 | Wei et al. | |
| 2004/0222511 A1 | 11/2004 | Zhang | |
| 2008/0079652 A1 | 4/2008 | Mohamadi | |
| 2011/0156224 A1* | 6/2011 | Rokuhara | H01L 23/552 257/659 |
| 2023/0420377 A1* | 12/2023 | Geyik | H01L 21/4857 |

* cited by examiner

*Primary Examiner* — Mohammad M Choudhry
(74) *Attorney, Agent, or Firm* — Anthony Canale (57) ABSTRACT

A structure including a first chip and a second chip stacked over the first chip is provided. The first chip includes a first dielectric over a substrate. The second chip includes a second dielectric over the first dielectric. An inductor is arranged at least in part in the first dielectric of the first chip. An electromagnetic shield structure is arranged around the inductor. The electromagnetic shield structure includes a lower shield portion extending at least partially through the first dielectric of the first chip and an upper shield portion extending at least partially through the second dielectric of the second chip. The electromagnetic shield structure is formed in part in the BEOL metallization structure in each of the first chip and the second chip in a heterogenous integration process.

16 Claims, 5 Drawing Sheets

SHIELDED INDUCTOR STRUCTURES AND METHODS OF FORMING THE SAME

TECHNICAL FIELD

The present disclosure relates generally to integrated circuits, and more particularly to devices including shielded inductor structures and methods of forming devices including shielded inductor structures.

BACKGROUND

As electronic components have become smaller, more of them can be integrated onto a single chip. Alongside transistors and other active components, passive components such as resistors, capacitors, and inductors are being integrated in semiconductor devices. The integration of passive components has played a role in expanding the capabilities of integrated circuits (ICs), enabling the development of more efficient and versatile electronic systems. The inclusion of inductors, in particular, have become increasingly important for various applications, such as but not limited to, power management, signal filtering, and wireless communication. For example, the integration of inductors into ICs has enabled the development of on-chip voltage regulators, Radio Frequency (RF) circuits, and more efficient power delivery systems. However, inductors have been a challenge to integrate due to their inherent physical characteristics, such as susceptibility to sources of electromagnetic interference which may impact the performance of the on-chip inductors. It is desirable to provide improved devices including shielded inductor structures and methods of forming thereof.

SUMMARY

According to various embodiments, a structure including a first chip and a second chip stacked over the first chip is provided. In one embodiment, the first chip includes a first dielectric over a substrate and the second chip includes a second dielectric over the first dielectric. An inductor is arranged at least in part in the first dielectric of the first chip. An electromagnetic shield structure is arranged around the inductor. The electromagnetic shield structure includes a lower shield portion extending at least partially through the first dielectric of the first chip and an upper shield portion extending at least partially through the second dielectric of the second chip. The lower shield portion includes metal layers and vias stacked vertically in the first dielectric of the first chip and the upper shield portion includes metal layers and vias stacked vertically in the second dielectric of the second chip.

According to another aspect, a structure including a first chip and a second chip stacked over the first chip to form a device stack is provided. The first chip includes a first dielectric over a substrate and a first layer of an inductor in the first dielectric. The second chip includes a second dielectric over the first dielectric, and a second layer of the inductor in the second dielectric. The second layer of the inductor is bonded to the first layer of the inductor. An electromagnetic shield structure is arranged around the inductor in the device stack. The electromagnetic shield structure includes a lower shield portion surrounding the first layer of the inductor in the first dielectric and an upper shield portion surrounding the second layer of the inductor in the second dielectric.

According to various embodiments, a method of forming a structure is provided. The method includes forming a first chip including a first dielectric over a first substrate, at least part of an inductor in the first dielectric, and a lower electromagnetic shield portion in the first dielectric. The lower electromagnetic shield portion surrounds at least part of the inductor in the first dielectric. The lower electromagnetic shield portion includes metal layers and vias stacked vertically in the first dielectric of the first chip. The method further includes forming a second chip including a second dielectric over a second substrate, and an upper electromagnetic shield portion in the second dielectric. The upper electromagnetic shield portion includes metal layers and vias stacked vertically in the second dielectric. The method may further include stacking the second chip over the first chip with a top surface of the second dielectric facing a top surface of the first dielectric and aligning the upper electromagnetic shield portion to the lower electromagnetic shield portion to form an electromagnetic shield structure around the inductor. The top surface of the first dielectric of the first chip is bonded to the top surface of the second dielectric of the second chip.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the embodiments. Other embodiments may be utilized and structural, logical, and electrical changes may be made without departing from the scope of the invention. The various embodiments are not necessarily mutually exclusive, as some embodiments can be combined with one or more other embodiments to form new embodiments.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Figure 1A:
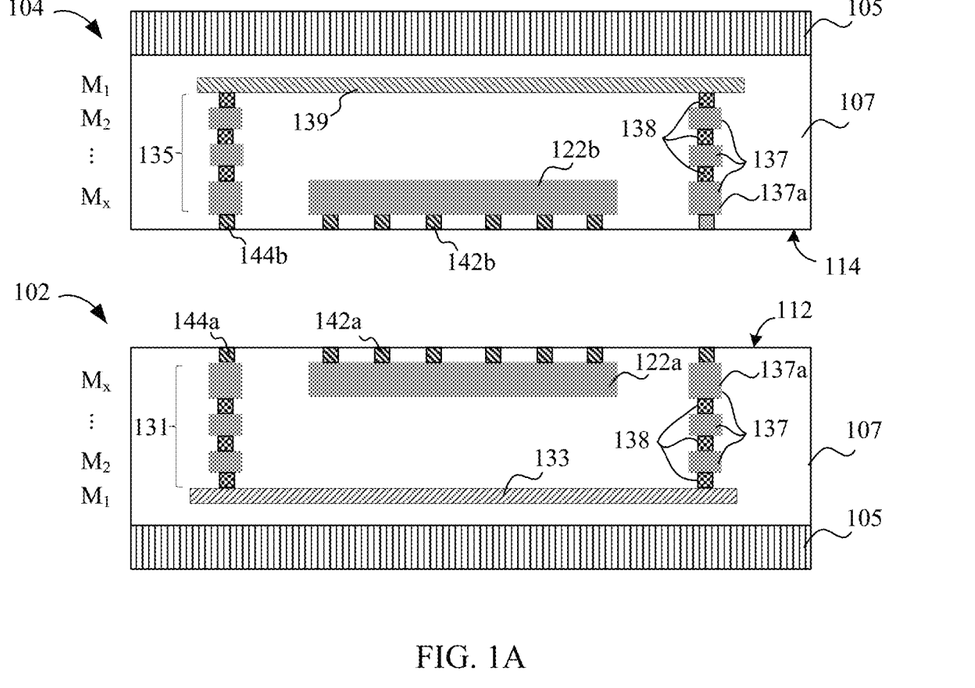
FIG. 1A illustrates a cross-sectional view of a first chip and a second chip at a fabrication stage of a method for forming a structure in accordance with various embodiments of the invention.

FIG. 1A illustrates a cross-sectional view of chip 102 and chip 104 at a fabrication stage of a method for forming a structure in accordance with various embodiments of the invention. The chips 102 and 104 may each be part of a respective wafer, or alternatively, individual chips after wafer singulation. The fabrication stage may be prior to bonding the chip 104 to the chip 102. As illustrated, the chip 104 is in a flipped orientation such that the front side or face of each of the chips 102 and 104 are facing one another.

The chip 102 and 104 may each include a substrate 105. The substrate 105 may be a semiconductor substrate, such as a silicon substrate. Other types of substrates, such as silicon germanium, germanium, gallium arsenide, or crystal-on-insulator (COI) such as silicon-on-insulator (SOI), may also be used. The chip 102 and the chip 104 may each include at least one electronic component or device arranged on the substrate 105 (not shown). A wiring or metallization structure may be arranged over the substrate 105 and the electronic component(s). The metallization structure may be formed in a back-end-of-line (BEOL) process. The metallization structure (or BEOL stack) may include a dielectric 107 and interconnects (not shown) disposed in the dielectric 107. The dielectric 107 of chip 102 may have a top surface 112, while the dielectric 107 of chip 104 may have a top surface 114. Although the dielectric 107 of chip 102 and the dielectric 107 of chip 104 are each illustrated as a single layer, it is understood that dielectric 107 may be formed of multiple layers of dielectric in the BEOL process. The dielectric 107 may be formed of one or more layers of dielectric material, such as silicon oxide, silicon nitride, low-k dielectric (e.g., SiCOH). The interconnects may include metal wiring layers and via contacts which connect various components to perform the desired functions. The metal layers may be arranged in a plurality of metal levels (e.g., $M_1$ to $M_x$) and the via contacts may interconnect the metal layers of the metal levels. The interconnects may be formed of metal such as copper, copper alloy, aluminum, tungsten or a combination thereof. Other suitable types of metal, alloys or conductive materials may also be useful.

An inductor may be arranged at least in part in the dielectric 107 of the chip 102. In one embodiment, the inductor may be fully arranged in the dielectric 107 of the chip 102 (not shown). In another embodiment, the inductor may be arranged in part in the dielectric 107 of the chip 102 and in part in the dielectric 107 of the chip 104. The chips 102 and 104 may then be aligned and stacked to form the inductor. FIG. 1A illustrates a first layer 122a of an inductor arranged in the dielectric 107 of chip 102 and a second layer 122b of the inductor arranged in the dielectric 107 of the chip 104. The first layer 122a of the inductor may be arranged adjacent to the top surface 112 of the dielectric 107 of chip 102. In one embodiment, the first layer 122a of the inductor may be arranged in an uppermost metal level of the metallization structure (e.g., $M_x$ of the metallization structure of chip 102), within the dielectric 107 of chip 102. As for the second layer 122b of the inductor, it may be arranged adjacent to the top surface 114 of the dielectric 107 of chip 102. Similarly, the second layer 122b of the inductor may be arranged in an uppermost metal level of the metallization structure of chip 104 (e.g., $M_x$ of the metallization structure of chip 104), within the dielectric 107 of chip 104. For example, providing the first layer 122a and the second layer 122b of the inductor in the uppermost metal level of the metallization structure and thus farthest away from the substrate 105 of chip 102 and chip 104, respectively, may reduce parasitic coupling (e.g., parasitic inductance or capacitance) from the substrates 105 of chip 102 and chip 104.

The first layer 122a and the second layer 122b of the inductor may be formed of a metallic material, such as copper (Cu) or aluminum (Al). For example, the first layer 122a and the second layer 122b of the inductor may each be formed in the respective chips 102 and 104 by depositing a layer of metallic material using sputtering or chemical vapor deposition (CVD) and patterning the layer of metallic material using lithography and etching processes. In some embodiments, the first layer 122a of the inductor may be formed in the same step as the metal layers in the uppermost metal level $M_x$ of the metallization structure of chip 102. Accordingly, the first layer 122a of the inductor, in one embodiment, may have a thickness of the uppermost metal level $M_x$ of the metallization structure of chip 102. Similarly, the second layer 122b of the inductor may be formed in the same step as the metal layers in the uppermost metal level $M_x$ of the metallization structure of chip 104. The second layer 122b of the inductor, in one embodiment, may have a thickness of the uppermost metal level $M_x$ of the metallization structure of chip 104. In some embodiments, the uppermost metal level $M_x$ of the metallization structure may be thicker than other metal levels. The first layer 122a of the inductor, for example, may have a thickness ranging from about 1.2 μm to about 4.0 μm, while second layer 122b of the inductor may have a thickness ranging from about 1.2 μm to about 4.0 μm. In one embodiment, the first layer 122a and the second layer 122b of the inductor may each be patterned to form a coil or spiral pattern with a plurality of turns arranged about a center region. In one embodiment, the respective coil with a plurality of turns of each of the first layer 122a and the second layer 122b of the inductor may be formed in a thick conductive layer (e.g., the uppermost metal level $M_x$ of the metallization structure of chip 102 and chip 104, respectively).

In one embodiment, a first electromagnetic shield portion 131 may be arranged in the dielectric 107 of chip 102 and a second electromagnetic shield portion 135 may be arranged in the dielectric 107 of chip 104. The first electromagnetic shield portion 131 may extend at least partially through the dielectric 107 of chip 102 and the second electromagnetic shield portion 135 may extend at least partially through the dielectric 107 of the chip 104. The first electromagnetic shield portion 131 and the second electromagnetic shield portion 135 may each be positioned in the metallization structure of chip 102 and chip 104, respectively, such that the first electromagnetic shield portion 131 and the second electromagnetic shield portion 135 are aligned to form an electromagnetic shield structure around the inductor when the chips 102 and 104 are stacked. In the case the inductor is fully arranged in the dielectric 107 of the chip 102, the first electromagnetic shield portion 131 may be arranged to surround the inductor in the dielectric 107 of chip 102, while the second electromagnetic shield portion 135 may be arranged in the dielectric 107 of chip 104 to correspond to a position of the first electromagnetic shield portion 131 such that the first electromagnetic shield portion 131 and the second electromagnetic shield portion 135 are aligned when the first and second chips 102 and 104 are stacked. In the case the inductor is arranged in part in the dielectric 107 of the chip 102 and in part in the dielectric 107 of the chip 104, the first electromagnetic shield portion 131 may surround the first layer 122a of the inductor in the dielectric 107 of chip 102 while the second electromagnetic shield portion 135 may surround the second layer 122b of the inductor in the dielectric 107 of chip 104.

In one embodiment, the first electromagnetic shield portion 131 may include metal layers 137 and vias 138 stacked vertically in the dielectric 107 of the chip 102. In one embodiment, the first electromagnetic shield portion 131 may extend at least from an upper metal level, such as the uppermost metal level, $M_x$, of the metallization structure of chip 102 to a depth beyond a bottom surface of the inductor (e.g., bottom surface of the first layer 122a of the inductor illustrated in FIG. 1A). In one embodiment, the first electromagnetic shield portion 131 may extend at least from an upper metal level, for example the uppermost metal level, $M_x$, of the metallization structure to beyond a lower metal level, for example beyond a second metal level, $M_2$, of the metallization structure of chip 102. In other embodiments, the first electromagnetic shield portion 131 may extend through a thickness of the dielectric 107 of the metallization structure of chip 102 to contact a top surface of the substrate 105 of chip 102. For example, the first electromagnetic shield portion 131 may extend from the uppermost metal level, $M_x$, to beyond a first metal level, $M_1$, of the metallization structure to contact a top surface of the substrate 105 of chip 102. The second electromagnetic shield portion 135 may include metal layers 137 and vias 138 stacked vertically in the dielectric 107 of the chip 104. In one embodiment, the second electromagnetic shield portion 135 may extend at least from an upper metal level, such as the uppermost metal level, $M_x$, of the metallization structure of chip 104 to a depth beyond a bottom surface of the second layer 122b of the inductor in the case that the inductor is formed in part in the dielectric 107 of chip 104, which is depicted as inverted in FIG. 1A. In one embodiment, the second electromagnetic shield portion 135 may extend at least from an upper metal level, for example the uppermost metal level, $M_x$, of the metallization structure to beyond a lower metal level, for example beyond a second metal level, $M_2$, of the metallization structure of chip 104. In other embodiments, the second electromagnetic shield portion 135 may extend through a thickness of the dielectric 107 of the metallization structure of chip 104 to contact a top surface of the substrate 105 of chip 104. For example, the second electromagnetic shield portion 135 may extend from the uppermost metal level, $M_x$, to beyond a first metal level, $M_1$, of the metallization structure to contact a top surface of the substrate 105 of chip 102.

Figure 1B:
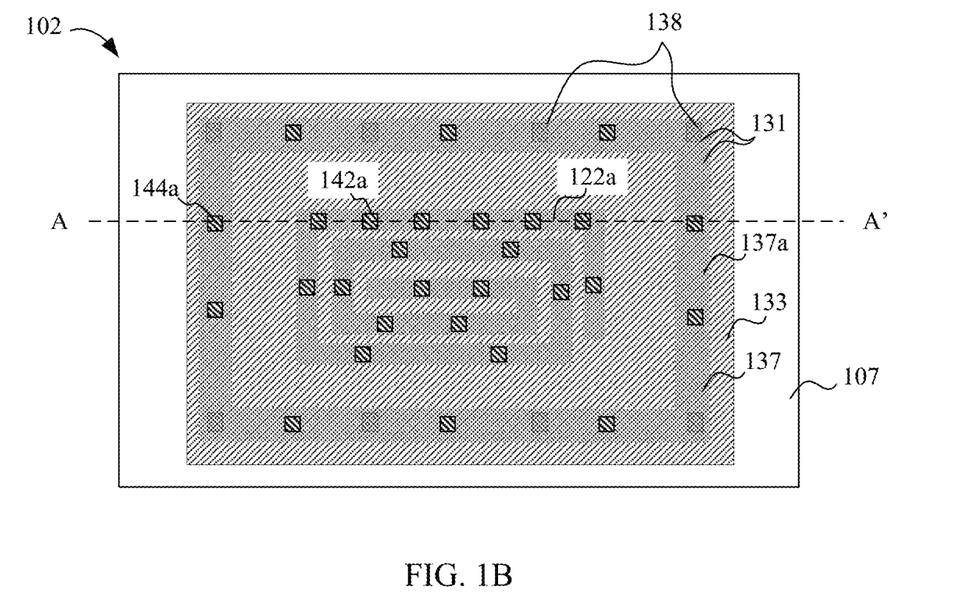
FIG. 1B illustrates a top-down view of a chip such as the first chip or the second chip of FIG. 1A.

The metal layers 137 and vias 138 of the first electromagnetic shield portion 131 and the second electromagnetic shield portion 135 may be arranged in an alternating manner (e.g., metal layers 137 and layers of vias 138 arranged alternately) to extend vertically through the dielectric 107 of chip 102 and the dielectric 107 of chip 104. The metal layers 137 and vias 138 may be formed in the same steps as the metal wiring layers (e.g., $M_1$ to $M_x$) and vias of the interconnects of the metallization structure in the BEOL process of each of the chips 102 and 104. The metal layers 137 and vias 138 of the second electromagnetic shield portion 135 in chip 104 may be arranged to correspond to a position of the metal layers 137 and vias 138 of the first electromagnetic shield portion 131 in chip 102 such that the metal layers 137 and vias 138 are aligned to surround the inductor when the chips 102 and 104 are stacked. In one embodiment, the metal layers 137 of the first electromagnetic shield portion 131 and the second electromagnetic shield portion 135 may be arranged around the inductor in a ring configuration (e.g., surround the inductor in a ring-like shape). In one embodiment, the metal layers 137 may surround the inductor (e.g., the first layer 122a and the second layer 122b of the inductor in FIG. 1A) in a continuous ring configuration. For example, the metal layers 137 may surround the inductor in a closed loop (e.g., without a disconnected portion) ring configuration. In one embodiment, at least one of the metal layers 137 has a closed loop ring configuration. In other embodiments, the metal layers 137 may each have a closed loop ring configuration. FIG. 1B is a top down view of the chip 102, illustrating portions of the first electromagnetic shield portion 131 surrounding the inductor (e.g., first layer 122a of the inductor) in the dielectric 107. The portions of the first electromagnetic shield portion 131 and the first layer 122a of the inductor shown in FIG. 1A correspond to a section taken along line A-A' in FIG. 1B. FIG. 1B illustrates the uppermost metal layer 137a of the first electromagnetic shield portion 131 having a continuous ring configuration around the first layer 122a of the inductor, and vias 138 below the uppermost metal layer 137a. In some embodiments, the vias 138 may be arranged in a discrete manner (e.g., discrete vias each spaced apart from one another by a distance). In other embodiments, a via 138 may have a continuous ring configuration below the uppermost metal layer 137a (not shown). A via 138 may have a width which is more narrow with respect to a width of a metal layer 137. The top down view of the chip 104 may be the same or similar to chip 102. The metal layers 137 and vias 138 of the first electromagnetic shield portion 131 and the second electromagnetic shield portion 135, for example, may be formed of a metallic material such as Cu or Al.

The first and second electromagnetic shield portions 131 and 135 may be laterally spaced apart from the inductor (e.g., layer 122a and layer 122b of the inductor) by a predetermined distance. For example, the first and second electromagnetic shield portions 131 and 135 may be laterally spaced from the inductor by a distance of about 20 um or greater, depending on application.

As described, the metal layers 137 and vias 138 may be formed in the same steps (e.g., simultaneously) as the interconnects of the metallization structure of each of the chip 102 and the chip 104. For example, a first patterned photoresist layer may be used to define locations of via openings for the interconnects of the metallization structure and the first electromagnetic shield portion 131/the second electromagnetic shield portion 135 to be etched into a layer of the dielectric 107 of chip 102/chip 104. A metal, such as Cu or Al, may be deposited into the via openings to form the vias for the interconnect and the first electromagnetic shield portion 131/the second electromagnetic shield portion 135. A second patterned photoresist layer may be used to define locations of trenches for the metal layers of the interconnects and the first electromagnetic shield portion 131/the second electromagnetic shield portion 135 to be etched into another layer of the dielectric 107 of chip 102/chip 104. A metal, such as Cu or Al for example, may be deposited into the trenches and a planarization step, such as chemical mechanical polishing, may be performed to form the metal layers for the interconnects and the first electromagnetic shield portion 131/the second electromagnetic shield portion 135.

In one embodiment, the inductor may be formed in the same step (e.g., simultaneously) as one or more metal layers 137 and/or one or more vias 138 of the first electromagnetic shield portion 131 and/or the interconnects of chip 102 in the case that the inductor is fully arranged in the dielectric 107 of the metallization structure of chip 102. In another embodiment, in the case that the inductor is arranged in part in the dielectric 107 of the chip 102 and in part in the dielectric 107 of the chip 104, the first layer 122a of the inductor may be formed in the same step (e.g., simultaneously) as the uppermost metal layer 137a of the first electromagnetic shield portion 131 of the chip 102, while the second layer 122b of the inductor may be formed in the same step (e.g., simultaneously) as the uppermost metal layer 137a of the second electromagnetic shield portion 135 of chip 104. A damascene and a dual damascene process may be used to form the inductor. For example, a first patterned photoresist layer may be used to define locations of openings corresponding to the first layer 122a of the inductor, the trench of the uppermost metal layer 137a of the first electromagnetic shield portion 131 and/or uppermost metal layers of the interconnects to be etched into a layer of the dielectric 107. A second patterned photoresist layer may be used to define locations of via openings of the vias of the first electromagnetic shield portion 131 and/or vias of the interconnects to be etched into another layer of the dielectric 107. A metal, such as Cu or Al, may be deposited into the openings, trenches and via openings and a planarization step, such as chemical mechanical polishing, may be performed to form the first layer 122a of the inductor and the uppermost metal layer 137a and vias 138 below the uppermost metal layer 137a for the first electromagnetic shield portion 131 and/or the uppermost metal layers and vias for the interconnects. Alternatively, the inductor may be formed in a different step from the uppermost metal layers 137a and vias 138 of the first electromagnetic shield portion 131/ second electromagnetic shield portion 135 and/or the interconnects. In one embodiment, a top surface of the first layer 122a of the inductor and a top surface of the uppermost metal layer 137a of the first electromagnetic shield portion 131 may be substantially coplanar. Similarly, a top surface of the second layer 122b of the inductor and a top surface of the uppermost metal layer 137a of the second electromagnetic shield portion 135 may be substantially coplanar.

In one embodiment, a shield plate 133 may be arranged in the dielectric 107 of chip 102. The shield plate 133, for example, may be used for shielding parasitic effects from the substrate 105 of chip 102, such as parasitic inductance or capacitance. The shield plate 133 may be arranged below the inductor (e.g., first layer 122a of the inductor as illustrated in FIG. 1A). The shield plate 133 may underlap the inductor and the first electromagnetic shield portion 131, and extend beyond a periphery of the first electromagnetic shield portion 131. The first electromagnetic shield portion 131 may abut the shield plate 133. For example, the bottommost vias 138 of the first electromagnetic shield portion 131 (e.g., below the metal layer 137 in metal level $M_2$) may abut a top surface of the shield plate 133. In one embodiment, the shield plate 133 may be a metallic mesh. The shield plate 133 may be, or serve as, a Faraday shield. The shield plate 133 may be arranged in a lower metal level of the metallization structure of chip 102. In one embodiment, the shield plate 133 may be arranged in the first metal level (e.g., $M_1$) of the metallization structure of chip 102. Positioning the shield plate 133 in the dielectric 107 furthest away from the inductor (e.g., first layer 122a of the inductor) may reduce oxide capacitance and in turn may improve the quality factor of the inductor. The shield plate 133 may be connected to ground through a metal wiring layer in the metallization structure of chip 102. The shield plate 133 may extend continuously below the first layer 122a of the inductor and the first electromagnetic shield portion 131 and beyond the periphery of the first electromagnetic shield portion 131 and may be in contact with the first electromagnetic shield portion 131 to form part of an enclosure (e.g., Faraday cage) which encloses the inductor.

In one embodiment, a shield plate 139 may be further arranged in the dielectric 107 of chip 104. The shield plate 139, for example, may be used for shielding parasitic effects from the substrate 105 of chip 104, such as parasitic capacitance or inductance. In the case that the inductor is formed in part in the dielectric 107 of chip 104, the shield plate 139 may underlap the second layer 122b of the inductor and the second electromagnetic shield portion 135, and extend beyond a periphery of the second electromagnetic shield portion 135. The second electromagnetic shield portion 135 may abut the shield plate 139. For example, the bottommost vias 138 of the second electromagnetic shield portion 135 (e.g., below the metal layer 137 in metal level $M_2$) may abut a top surface of the shield plate 139. The shield plate 139 may be a metallic mesh, similar to the shield plate 133 illustrated in FIG. 1A and FIG. 1B. The shield plate 139 may be arranged in a lower metal level of the metallization structure of chip 104. In one embodiment, the shield plate 139 may be arranged in the first metal level (e.g., $M_1$) of the metallization structure. As illustrated in FIG. 1A which is depicted as inverted, the shield plate 139 may extend continuously below the second electromagnetic shield portion 135 and beyond the periphery of the second electromagnetic shield portion 135 and may be in contact with the second electromagnetic shield portion 135 to form a remaining part of the enclosure with encloses the inductor. The shield plate 139 may be connected to ground through a metal wiring layer in the metallization structure of chip 104.

Figure 1C:
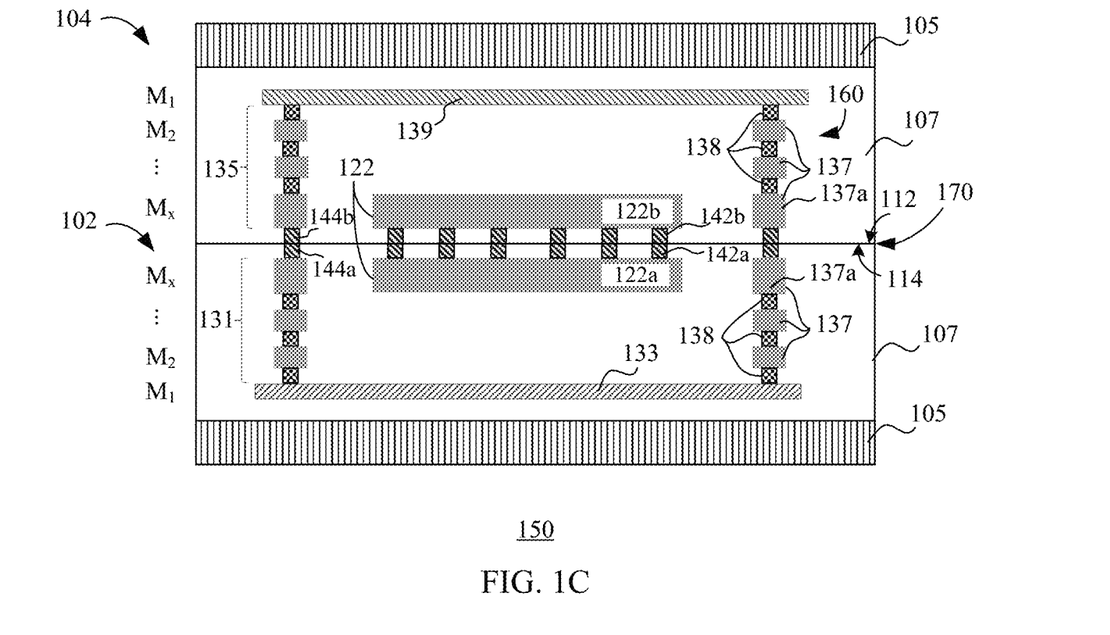
FIG. 1C illustrates a cross-sectional view of an embodiment of a structure including the first and second chips of FIG. 1A, in accordance with various embodiments of the invention.
Figure 1D:
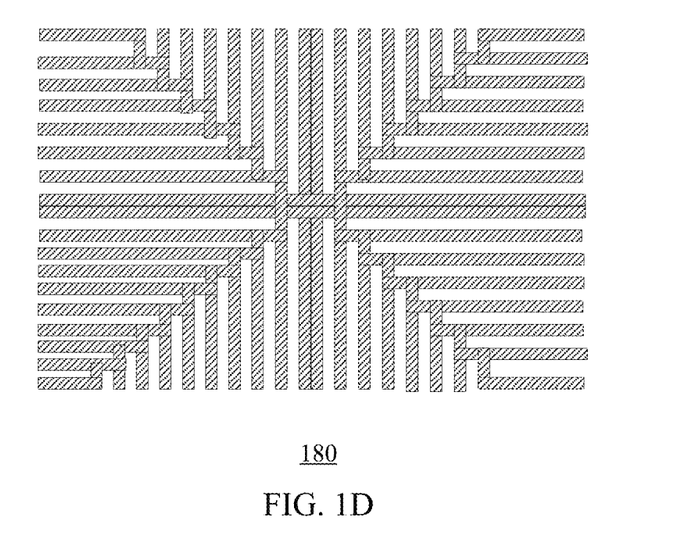
FIG. 1D illustrates an exemplary metallic mesh, according to various embodiments.

FIG. 1D illustrates an exemplary metallic mesh 180 of the shield plate 133 and/or the shield plate 139, according to various embodiments. The shield plate 133 and the shield plate 139 may be formed of a metallic material such as Cu or Al for example, in the BEOL process. For example, a layer of the metallic material may be deposited by CVD and patterned by lithography and etching processes. The shield plate 133 may have a thickness, for example, ranging from about 0.3 um to about 0.4 um, while the shield plate 139 may have a thickness ranging from about 0.3 um to about 0.4 um.

Referring back to FIG. 1A, bonding vias 144a may be arranged on the uppermost metal layer 137a of the first electromagnetic shield portion 131 in chip 102. The bonding vias 144a may be in the form of a plurality of discrete vias or pillars. The bonding vias 144a may be arranged along a top surface of the uppermost metal layer 137a of the first electromagnetic shield portion 131 in chip 102. In the case that the inductor is arranged in part in the dielectric 107 of the chip 102 and in part in the dielectric 107 of the chip 104, in one embodiment, a first set of bonding vias 142a may be arranged on the first layer 122a of the inductor in chip 102. The first set of bonding vias 142a and the bonding vias 144a may be at the same level or at the same height from the top surface of substrate 105 of chip 102. A top surface of the first set of bonding vias 142a and the bonding vias 144a may be substantially coplanar with the top surface 112 of the dielectric 107 of chip 102. For example, a planarization process such as chemical mechanical polishing may be performed to provide a substantially planar top surface. Similarly, bonding vias 144b may be arranged on the uppermost metal layer 137a of the second electromagnetic shield portion 135 in chip 104. The bonding vias 144b may be arranged along a top surface of the uppermost metal layer 137a of the second electromagnetic shield portion 135 in chip 104. The bonding vias 144b may be positioned to correspond to the location of the bonding vias 144a such that the bonding vias may be aligned when the chips 102 and 104 are stacked and bonded together in a bonding process. The first electromagnetic shield portion 131 and the second electromagnetic shield portion 135 may be bonded together through the bonding vias 144a and 144b. In other words, the uppermost metal layer 137a of the first electromagnetic shield portion 131 of chip 102 may be connected to the uppermost metal layer 137a of the second electromagnetic shield portion 135 of chip 104. A second set of bonding vias 142b may be arranged on the second layer 122b of the inductor in chip 104. The second set of bonding vias 142b and the bonding vias 144b may be at the same level or at the same height from the top surface of substrate 105 of chip 104. A top surface of the second set of bonding vias 142b and the bonding vias 144b may be substantially coplanar with the top surface 114 of the dielectric 107 of chip 104. The second set of bonding vias 142b may be positioned to correspond to the location of the first set of bonding vias 142a such that the bonding vias 142a and 142b may be aligned when the chips 102 and 104 are stacked and bonded together in the bonding process. The first layer 122a of the inductor and the second layer 122b of the inductor may be bonded together through the first set of bonding vias 142a and the second set of bonding vias 142b. The first set of bonding vias 142a, the second set of bonding vias 142b and the bonding vias 144a and 144b may be formed of a metallic metal such as Cu.

FIG. 1B illustrates an exemplary arrangement of the first set of bonding vias 142a which may be used in a parallel stacked inductor. More particularly, the first set of bonding vias 142a may be arranged in a distributed manner along a top surface of the first layer 122a of the inductor. In the case that the first layer 122a and the second layer 122b of the inductor each has a spiral pattern with a plurality of turns arranged about a center region, the first set of bonding vias 142a may be distributed along the plurality of turns of the first layer 122a of the inductor, as illustrated in FIG. 1B. Similarly, the second set of bonding vias 142b may be distributed along the plurality of turns of the second layer 122b of the inductor (not shown in FIG. 1B). The second set of bonding vias 142b may correspond to a position of the first set of bonding vias 142a when the chips 102 and 104 are stacked. In the case of a series stacked inductor, the first set of bonding vias 142a may be arranged in a concentrated manner on an innermost edge portion of the plurality of turns of the first layer 122a of the inductor, and the second set of bonding vias 142b may be arranged in a concentrated manner on an innermost edge portion of the plurality of turns of the second layer 122b of the inductor (not shown in FIG. 1B).

The chip 104 may be stacked over chip 102. The chips 102 and 104 may be moved such that the first electromagnetic shield portion 131 and the second electromagnetic shield portion 135 are aligned and stacked one over another to form the enclosure or electromagnetic shield structure 160 around the inductor. FIG. 1C illustrates a cross-sectional view of an embodiment of a structure 150. The structure 150 may include chip 104 stacked over chip 102 with the front of chip 102 (e.g., top surface 112 of dielectric 107 of chip 102) facing the front of chip 104 (e.g., top surface 114 of dielectric 107 of chip 104) to form a stacked device. In the case that the inductor is formed of the first layer 122a in the dielectric 107 of chip 102 and the second layer 122b in the dielectric 107 of chip 104, the first layer 122a and the second layer 122b may be aligned and stacked one over another to form the inductor 122.

The chip 104 may be bonded to the chip 102 through face-to-face bonding. The front of chip 102 may be bonded to the front of chip 104, for example, via wafer bonding processes. The chips 102 and 104 may be bonded together at a bonding interface 170. The top surface 112 of the dielectric 107 of chip 102 may directly contact the top surface 114 of the dielectric 107 of chip 104 at the bonding interface 170. A top surface of the bonding vias 144a may directly contact a top surface of the corresponding bonding vias 144b. A top surface of the first set of bonding vias 142a may directly contact a top surface of the corresponding second set of bonding vias 142b. In one embodiment, the chips 102 and 104 may be bonded together via hybrid bonding. For example, metal-metal bonds (e.g., Cu—Cu bonds) may be formed between the bonding vias 144a of chip 102 and the corresponding bonding vias 144b of chip 104, between the first set of bonding vias 142a of chip 102 and the corresponding second set of bonding vias 142b of chip 104, and dielectric-dielectric bonds (e.g., oxide-oxide bonds) may be formed between the dielectric 107 of chip 102 and the dielectric 107 of chip 104. For example, standard thermocompressive bonding tools and techniques may be used. For example, an anneal process may be performed for interconnect formation. The second electromagnetic shield portion 135 may be bonded to the first electromagnetic shield portion 131 through the bonding vias 144a and 144b. The second layer 122b of the inductor may be bonded to the first layer 122a of the inductor through the first set of bonding vias 142a and the second set of bonding vias 142b.

As illustrated in FIG. 1C, the electromagnetic shield structure 160 may be arranged around the inductor 122 and may be positioned in the dielectric 107 of chip 102 and the dielectric 107 of chip 104. The electromagnetic shield structure 160 may extend at least partially through the dielectric 107 of chip 102 and the dielectric 107 of chip 104 with the first electromagnetic shield portion 131 being a lower electromagnetic shield portion of the electromagnetic shield structure 160 and the second electromagnetic shield portion 135 being an upper electromagnetic shield portion of the electromagnetic shield structure 160. The first electromagnetic shield portion 131 and the second electromagnetic shield portion 135 of the electromagnetic shield structure 160 may surround the inductor 122 in a ring configuration. The first electromagnetic shield portion 131 and the second electromagnetic shield portion 135 of the electromagnetic shield structure 160 may surround the inductor in three directions (e.g., x, y, and z-directions). The electromagnetic shield structure 160, in one embodiment, may further include the shield plate 133 and the shield plate 139. The shield plate 133, for example, may be below the inductor 122, while the shield plate 139 may be above the inductor 122 when the chips 102 and 104 are stacked. The shield plate 133 underlaps the inductor 122 and the first electromagnetic shield portion 131 and extends beyond a periphery of the first electromagnetic shield portion 131, while the shield plate 139 overlaps the inductor 122 and the second electromagnetic shield portion 135 and extends beyond a periphery of the second electromagnetic shield portion 135. The first electromagnetic shield portion 131, the second electromagnetic shield portion 135 and the shield plates 133 and 139 may form the electromagnetic shield structure 160 which encloses the inductor 122 (e.g., surrounds or bounds the inductor 122 on all sides/surfaces). The electromagnetic shield structure 160 may be a three-dimensional (3D) structure surrounding the inductor 122 in the bonded chips 102 and 104. The electromagnetic shield structure 160 may be a Faraday cage enclosing the inductor 122, providing 3D shielding (e.g., in the x, y and z directions) to the inductor 122 to reduce the coupling to or from nearby devices/circuits (including devices/circuits within the chips 102 and 104) and the substrates 105 of chip 102 and chip 104. In one embodiment, the electromagnetic shield structure 160 may provide complete isolation for the inductor 122, for example, from sources of interference (e.g., generated by external electromagnetic fields).

The inductor 122 may be connected to the circuit(s) in chip 102 and/or chip 104 depending on application. The inductor 122 may be connected using a conductive layer in the metallization structure. For example, an opening may be formed in the uppermost metal layer 137a of chip 102 to accommodate the conductive layer for forming a connection to the inductor 122.

Accordingly, a first chip with the first electromagnetic shield portion 131 and the shield plate 133 forming a lower portion of the electromagnetic shield structure 160 and a second chip with the second electromagnetic shield portion 135 and the shield plate 139 forming an upper portion of the electromagnetic shield structure 160 may be formed in a heterogeneous integration process. The first chip and the second chip may be stacked and bonded together to form the electromagnetic shield structure 160 which encloses the inductor 122.

The shield plates 133 and 139 may be provided in the case the substrates 105 of chips 102 and 104 has a resistivity below a predetermined range. The predetermined range of the substrate resistivity, for example, may be about 100 ohm-cm or less. As described, the shield plate 133 and/or shield plate 139 may be used for shielding parasitic effects from the substrate 105, such as parasitic inductance or capacitance. The parasitic inductance may be due to the electromagnetic field interaction with the substrate 105 which may form eddy currents in a low resistivity substrate, and reduce the actual device inductance value. In other cases where the resistivity of the substrate 105 is above the predetermined range, the shield plate 133 and/or shield plate 139 need not be provided.

Figure 2:
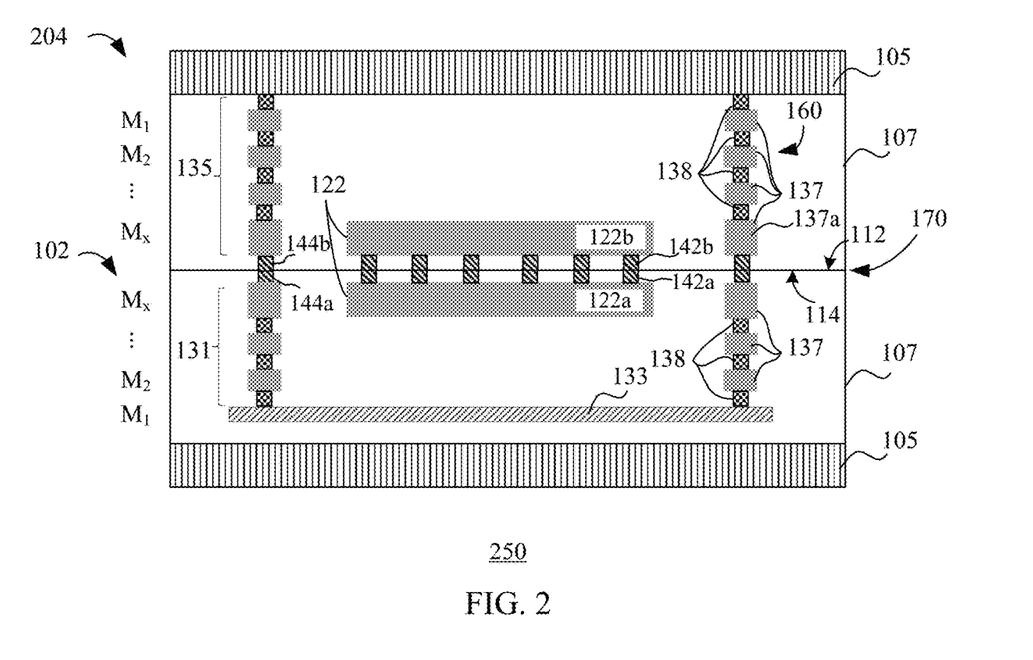
FIGS. 2 to 4 show exemplary cross-sectional views of other embodiments of a structure, in accordance with various embodiments of the invention.

FIG. 2 shows an exemplary cross-sectional view of an embodiment of a structure 250 having chip 204 stacked over and bonded to chip 102. The structure 250, for example, is similar to that described in FIG. 1C. As such, common elements may not be described or described in detail. Referring to FIG. 2, the chip 204 may be similar to the chip 104, but chip 204 may be formed without a shield plate in the dielectric 107 of chip 204 for the electromagnetic shield structure 160, and the second electromagnetic shield portion 135 of chip 204 may have a different depth in the dielectric 107 from that of chip 104 illustrated in FIG. 1C. For example, in the case that the substrate 105 of chip 204 has a resistivity above the predetermined range, a shield plate need not be provided in the dielectric 107 of chip 204 for the electromagnetic shield structure 160. In one embodiment, the second electromagnetic shield portion 135 may extend completely through a thickness of the dielectric 107 of chip 204. In one embodiment, the second electromagnetic shield portion 135 of chip 204 may extend from the uppermost metal level, $M_x$ of the metallization structure to a top surface of the substrate 105 of chip 204. The electromagnetic shield structure 160 may include the first electromagnetic shield portion 131 and the second electromagnetic shield portion 135 surrounding the inductor 122 in a ring configuration, and the shield plate 133 below the inductor 122 and the first electromagnetic shield portion 131 when the chips 102 and 204 are stacked. The second electromagnetic shield portion 135 of chip 204 may abut the top surface of the substrate 105 such that the first electromagnetic shield portion 131, the second electromagnetic shield portion 135 and the shield plate 133 encloses the inductor 122 in the BEOL stack. The electromagnetic shield structure 160 may provide on-chip 3D shielding to the inductor 122 to reduce the coupling from nearby devices/circuits, as well as from the substrate 105 of chip 102.

Figure 3:
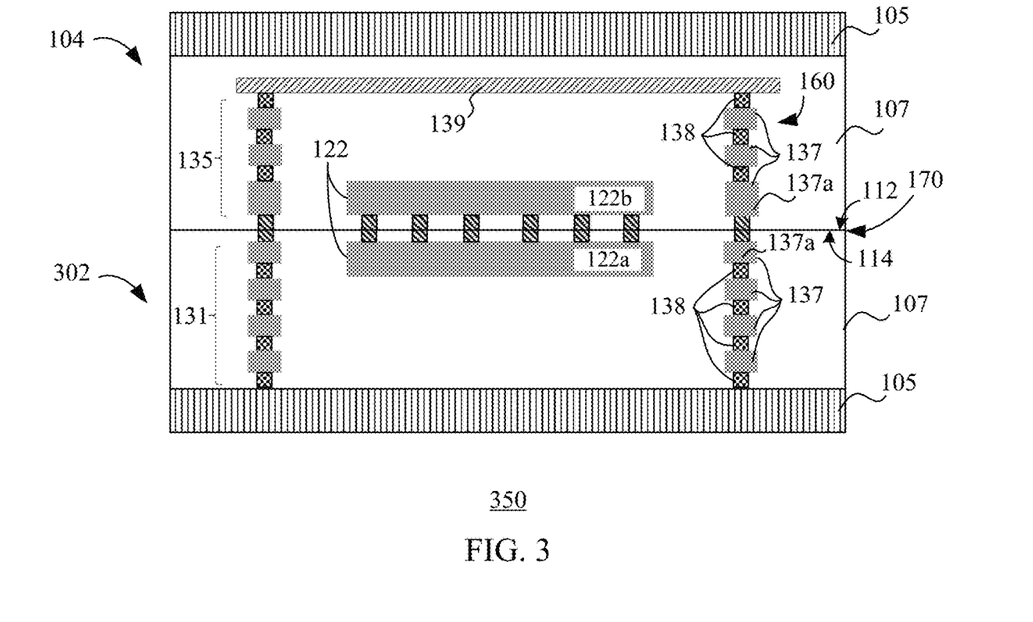

FIG. 3 shows an exemplary cross-sectional view of an embodiment of a structure 350 having chip 104 stacked over and bonded to chip 302. The structure 350, for example, is similar to that described in FIG. 1C and FIG. 2. As such, common elements may not be described or described in detail. Referring to FIG. 3, the chip 302 may be similar to chip 102, but chip 302 may be formed without a shield plate in the dielectric 107 of chip 302 for the electromagnetic shield structure 160, and the first electromagnetic shield portion 131 of chip 302 may have a different depth in the dielectric 107 from that of chip 102, similar to that described with respect to the second electromagnetic shield portion 135 of chip 204. For example, in the case that the substrate 105 of chip 302 has a resistivity above the predetermined range, a shield plate need not be provided in the dielectric 107 of chip 302 for the electromagnetic shield structure 160. In one embodiment, the first electromagnetic shield portion 131 may extend completely through a thickness of the dielectric 107 of chip 302. The first electromagnetic shield portion 131 of chip 302 may extend from the uppermost metal level, $M_x$ of the metallization structure to a top surface of the substrate 105 of chip 302. The electromagnetic shield structure 160 may include the first electromagnetic shield portion 131 and the second electromagnetic shield portion 135 surrounding the inductor 122 in the ring configuration, and the shield plate 139 above the inductor 122 when the chips 302 and 104 are stacked. The first electromagnetic shield portion 131 of chip 302 may abut the top surface of the substrate 105 such that the first electromagnetic shield portion 131, the second electromagnetic shield portion 135 and the shield plate 139 encloses the inductor 122 in the BEOL stack. The electromagnetic shield structure 160 may provide on-chip 3D shielding to the inductor 122 to reduce the coupling from nearby devices/circuits, as well as from the substrate 105 of chip 104.

Figure 4:
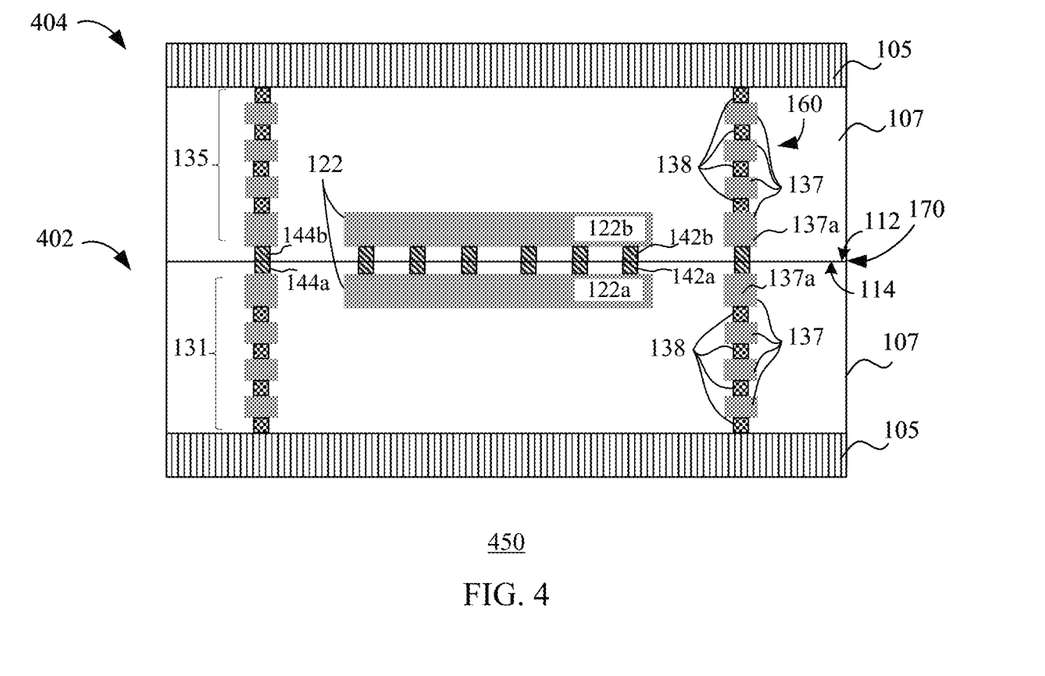

In yet another embodiment where the substrates 105 of the stacked chips have respective resistivity above the predetermined range, the electromagnetic shield structure 160 need not be provided with shield plates in the dielectric 107 of the chips. FIG. 4 shows an exemplary cross-sectional view of an embodiment of a structure 450 having chip 404 stacked over and bonded to chip 402. The structure 450, for example, is similar to that described in FIGS. 1C, 2 and 3. As such, common elements may not be described or described in detail. Referring to FIG. 4, the chip 402 may be similar to chip 102, and chip 404 may be similar to chip 104, but chips 402 and 404 may be provided without a shield plate in the respective dielectric 107 of chips 402 and 404. The electromagnetic shield structure 160 may include the first electromagnetic shield portion 131 and the second electromagnetic shield portion 135 surrounding the inductor 122 in a ring configuration when the chips 402 and 404 are stacked. The first electromagnetic shield portion 131 may extend completely through a thickness of the dielectric 107 of chip 402, while the second electromagnetic shield portion 135 may extend completely through a thickness of the dielectric 107 of chip 404. The first electromagnetic shield portion 131 of chip 402 may abut the top surface of the substrate 105 of chip 402, while the second electromagnetic shield portion 135 of chip 404 may abut the top surface of the substrate 105 of chip 404 such that the first electromagnetic shield portion 131 and the second electromagnetic shield portion 135 encloses the inductor 122 in the BEOL stack. The electromagnetic shield structure 160 may provide on-chip 3D shielding to the inductor 122 to reduce the coupling from nearby devices/circuits.

Figure 5A:
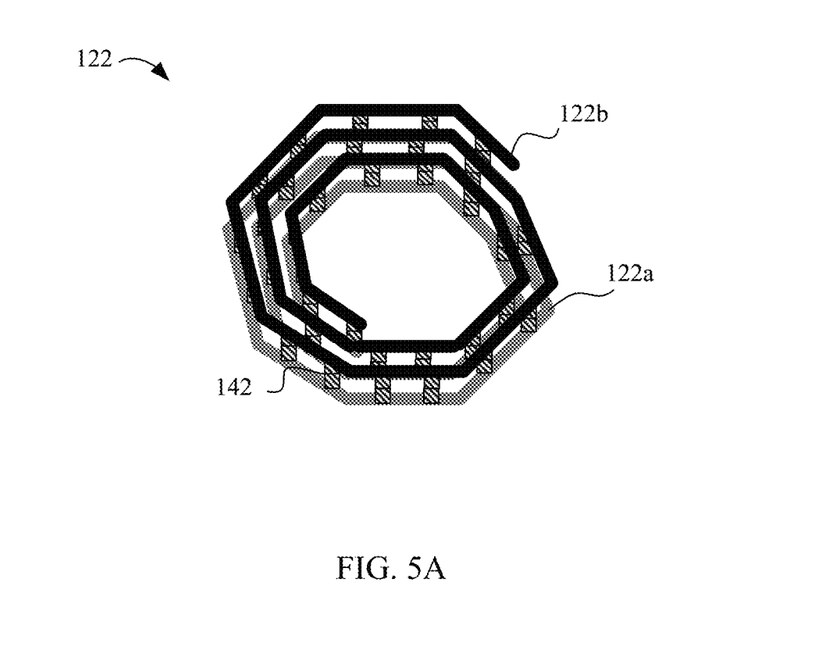
FIGS. 5A-5B show exemplary perspective views of an inductor, in accordance with various embodiments of the invention.
Figure 5B:
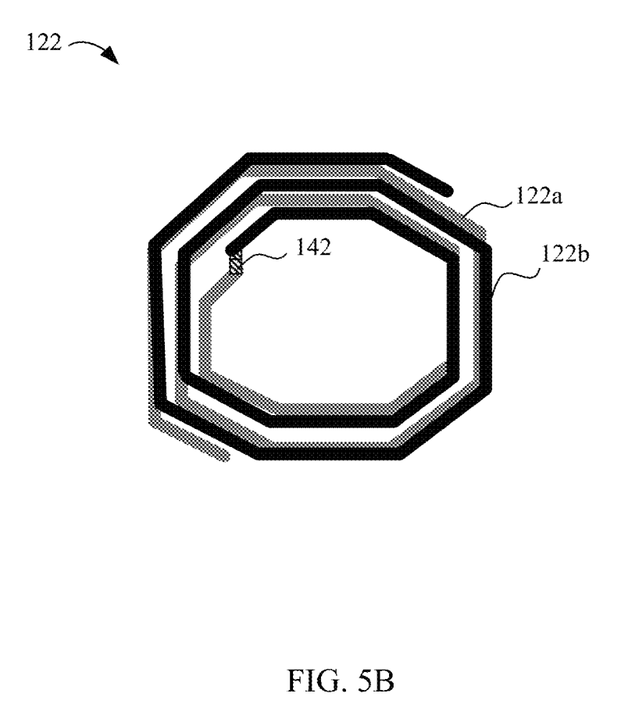

FIGS. 5A-5B show exemplary schematics of the inductor 122, according to various embodiment of the invention. Referring to FIG. 5A and FIG. 5B, the inductor 122 may include first layer 122a, and second layer 122b stacked over the first layer 122a. The first layer 122a of the inductor and the second layer 122b of the inductor may each have coil or spiral pattern with a plurality of turns arranged about a center region. In one embodiment, the first layer 122a of the inductor and the second layer 122b of the inductor may be electrically connected in parallel using bonding vias 142 to form a parallel stacked inductor, as illustrated in FIG. 5A. In this case, the bonding vias 142 may include the first set of bonding vias 142a and the second set of bonding vias 142b (e.g., illustrated in FIGS. 1A, 1B and 1C) positioned along the spiral of the first layer 122a of the inductor and the second layer 122b of the inductor, respectively. The bonding vias 142 may be discrete vias or pillars arranged between the first layer 122a of the inductor and the second layer 122b of the inductor. The parallel stacked inductor may have high quality factor, for example, compared to a single layer spiral inductor.

In another embodiment, the first layer 122a of the inductor and the second layer 122b of the inductor may be electrically connected in series using bonding vias 142 to form a series stacked inductor as illustrated in FIG. 5B. In this case, the bonding vias 142 may include the first set of bonding vias 142a and the second set of bonding vias 142b positioned at the innermost edge portions of the spiral of the first layer 122a of the inductor and the second layer 122b of the inductor, respectively. The bonding vias 142 may be discrete vias or pillars arranged between the first layer 122a of the inductor and the second layer 122b of the inductor. The series stacked inductor may have high inductance density, for example, compared to a single layer spiral inductor.

Various embodiments provide a stacked device with an electromagnetic shield structure arranged at least around an on-chip inductor which reduces or prevents parasitic coupling, such as parasitic inductance or capacitance from surrounding devices/circuits and/or substrate, and thus improve the performance of the inductor (e.g., inductance density, quality factor). As described, the electromagnetic shield structure may be formed of chip level metals and vias which are arranged to surround the inductor in the stacked chips. The shield structure may be formed in the same steps as the interconnects in the metallization structure.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A structure, comprising:
a first chip including a first dielectric over a substrate;
a second chip stacked over the first chip, the second chip including a second dielectric over the first dielectric;
an inductor arranged at least in part in the first dielectric of the first chip; and
an electromagnetic shield structure around the inductor, the electromagnetic shield structure comprising a lower shield portion extending at least partially through the first dielectric of the first chip and an upper shield portion extending at least partially through the second dielectric of the second chip, wherein the lower shield portion comprises first metal layers and vias stacked vertically in the first dielectric of the first chip and the upper shield portion comprises second metal layers and vias stacked vertically in the second dielectric of the second chip, the first metal layers of the electromagnetic shield structure each having a ring configuration around the inductor in the first dielectric of the first chip and the second metal layers of the electromagnetic shield structure each having a ring configuration in the second dielectric of the second chip above the first metal layers.

2. The structure of claim 1, wherein at least one of the metal layers has a closed loop ring configuration.

3. The structure of claim 1, wherein the electromagnetic shield structure further comprises a shield plate in the first dielectric, the shield plate underlaps the inductor and the lower shield portion, and extends beyond a periphery of the lower shield portion, wherein the lower shield portion abuts the shield plate.

4. The structure of claim 3, wherein the electromagnetic shield structure further comprises a second shield plate in the second dielectric, the second shield plate overlaps the inductor and the upper shield portion, and extends beyond a periphery of the upper shield portion, wherein the upper shield portion abuts the second shield plate, and the lower shield portion, the upper shield portion, the shield plate and second shield plate forms a Faraday cage which encloses the inductor.

5. The structure of claim 3, wherein the shield plate is coupled to ground.

6. The structure of claim 3, wherein the shield plate is a metallic mesh.

7. The structure of claim 3, wherein the second chip further includes a second substrate over the second dielectric and the upper shield portion extends through the second dielectric and abuts a top surface of the second substrate.

8. The structure of claim 1, further comprising first bonding vias on an uppermost metal layer of the lower shield portion, and second bonding vias on an uppermost metal layer of the upper shield portion, wherein the lower shield portion and the upper shield portion are bonded by the first bonding vias and second bonding vias.

9. The structure of claim 1, wherein the inductor comprises a first layer arranged in the first dielectric of the first chip and a second layer arranged in the second dielectric of the second chip, wherein the first layer and the second layer each has a coil pattern with a plurality of turns, and the second layer is stacked over the first layer.

10. The structure of claim 9, wherein at least an uppermost first metal layer of the shield lower portion completely surrounds the first layer of the inductor in the first dielectric and at least an uppermost second metal layer of the shield upper portion completely surrounds the second layer of the inductor in the second dielectric.

11. The structure of claim 9, wherein the second layer of the inductor is bonded to the first layer of the inductor through a plurality of bonding vias.

12. The structure of claim 9, wherein the second layer of the inductor is electrically connected to the first layer of the inductor in parallel.

13. The structure of claim 9, wherein the second layer of the inductor is connected to the first layer of the inductor in series.

14. A structure, comprising:
- a first chip including a first dielectric over a substrate and a first layer of an inductor in the first dielectric;
- a second chip stacked over the first chip to form a device stack, the second chip including a second dielectric over the first dielectric and a second layer of the inductor in the second dielectric, wherein the second layer of the inductor is bonded to the first layer of the inductor; and
- an electromagnetic shield structure around the inductor in the device stack, the electromagnetic shield structure comprising a lower shield portion including first metal layers surrounding the first layer of the inductor in the first dielectric in a ring configuration and an upper shield portion including second metal layers surrounding the second layer of the inductor in the second dielectric in a ring configuration.

15. The structure of claim 14, wherein the lower shield portion further comprises vias stacked alternately with the first metal layers in the first dielectric of the first chip and the upper shield portion comprises vias stacked alternately with the second metal layers in the second dielectric of the second chip.

16. The structure of claim 14, further comprising a shield plate in the first dielectric, the shield plate underlaps the first layer of the inductor and the lower shield portion in the first dielectric and extends beyond a periphery of the lower shield portion, and wherein the lower shield portion abuts the shield plate.

\* \* \* \* \*